(12) United States Patent
Braun

(10) Patent No.: US 11,680,973 B1
(45) Date of Patent: Jun. 20, 2023

(54) ELECTRIC POTENTIAL AND ELECTRIC FIELD MAPPING SYSTEM

(71) Applicant: Jack Braun, Eastampton, NJ (US)

(72) Inventor: Jack Braun, Eastampton, NJ (US)

( * ) Notice: Subject to any disclaimer, the term of this patent is extended or adjusted under 35 U.S.C. 154(b) by 0 days.

(21) Appl. No.: 17/694,891

(22) Filed: Mar. 15, 2022

(51) Int. Cl.
*G01R 29/14* (2006.01)
*G01R 29/08* (2006.01)

(52) U.S. Cl.
CPC ......... *G01R 29/14* (2013.01); *G01R 29/0871* (2013.01); *G01R 29/0878* (2013.01)

(58) Field of Classification Search
CPC . G01R 29/14; G01R 29/0871; G01R 29/0878
See application file for complete search history.

(56) References Cited

U.S. PATENT DOCUMENTS

| | | | |
|---|---|---|---|
| 2008/0183076 A1* | 7/2008 | Witte | A61B 5/4064 600/438 |
| 2012/0199755 A1* | 8/2012 | Generazio | G01T 1/00 250/336.1 |
| 2016/0363621 A1* | 12/2016 | Kalokitis | G01R 29/14 |
| 2018/0203051 A1* | 7/2018 | Generazio | G01R 29/0878 |
| 2019/0262609 A1* | 8/2019 | Brill | A61N 1/36071 |

* cited by examiner

*Primary Examiner* — Alvaro E Fortich
(74) *Attorney, Agent, or Firm* — Andrew L. Salvatore, Esquire

(57) ABSTRACT

An electrical field mapping system with an improved measurement and recording method which enables students to produce an electric field map of equipotential lines and electric field vectors. Measurements of an electric potential point and an electric field vector may be made by a three-probe sensor with pointer and displayed on voltmeters. An angular scale below the pointer may assist to measure the direction of the electric field. An X-Y transfer mechanism transfers the location of the three-probe sensor, from the space around electrodes, to a marker at a corresponding location in the recording area. Recordings of the field data are made by markers with different impressions and may include an electric field vector, equipotential line segment, and electric potential point.

18 Claims, 6 Drawing Sheets

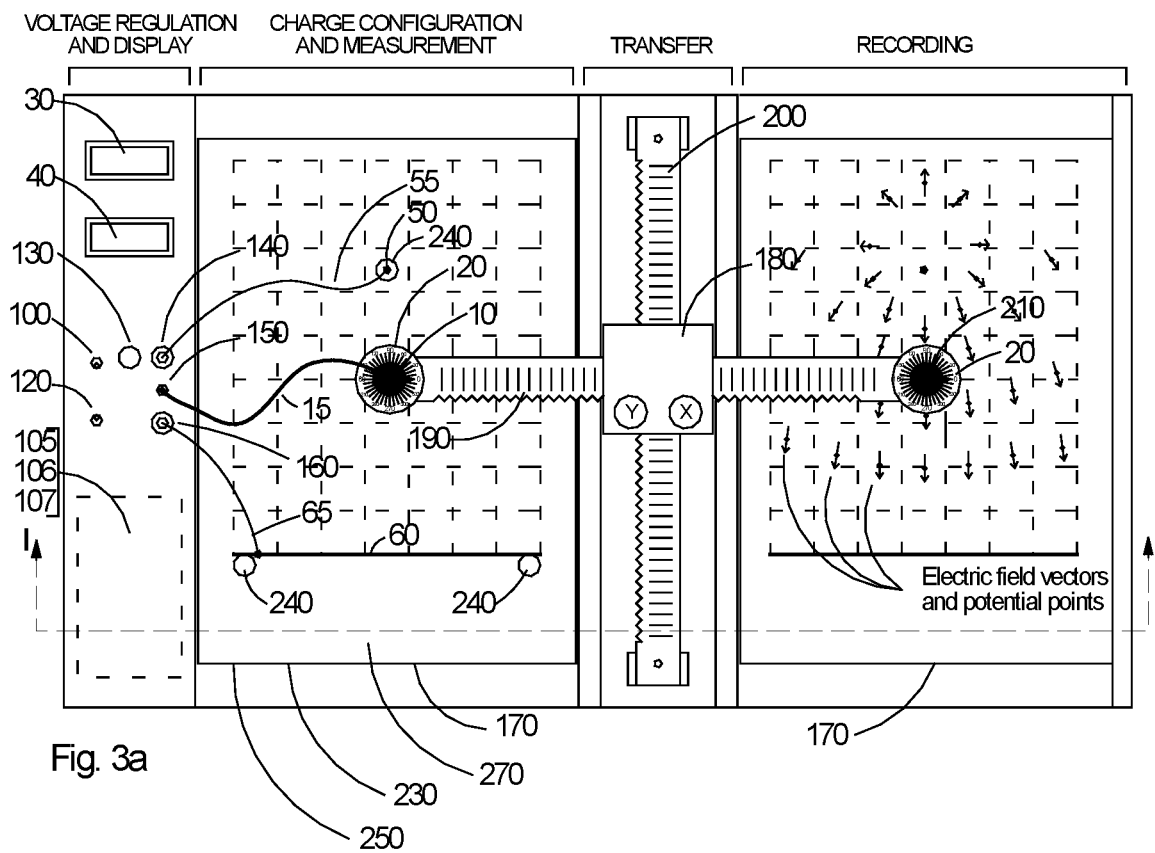

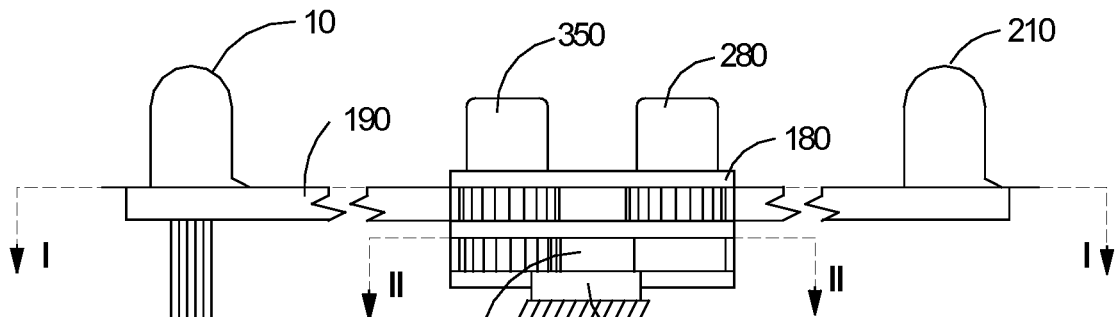
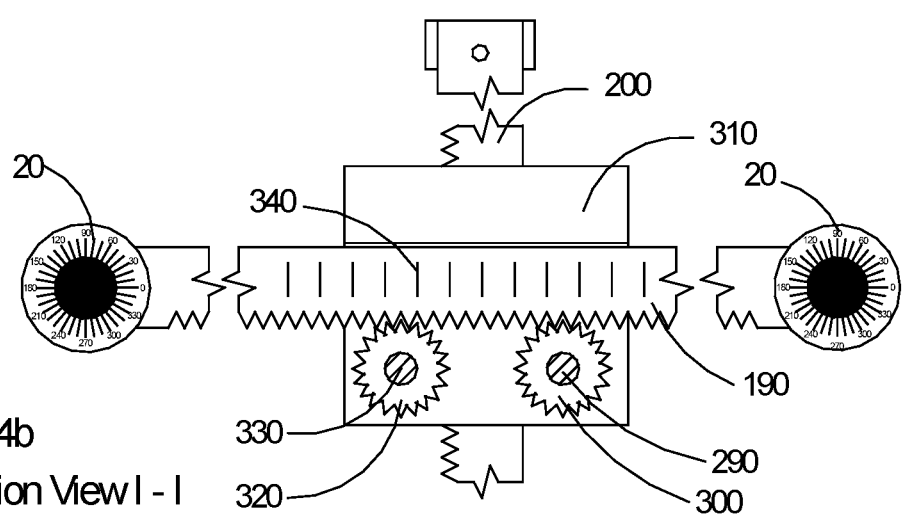
Fig. 4a
Fig. 4b
Section View I - I
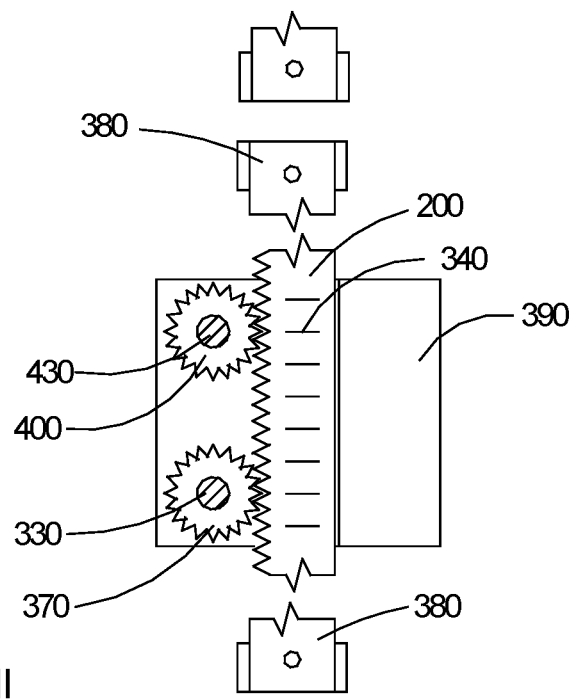
Fig. 4c
Section View II - II

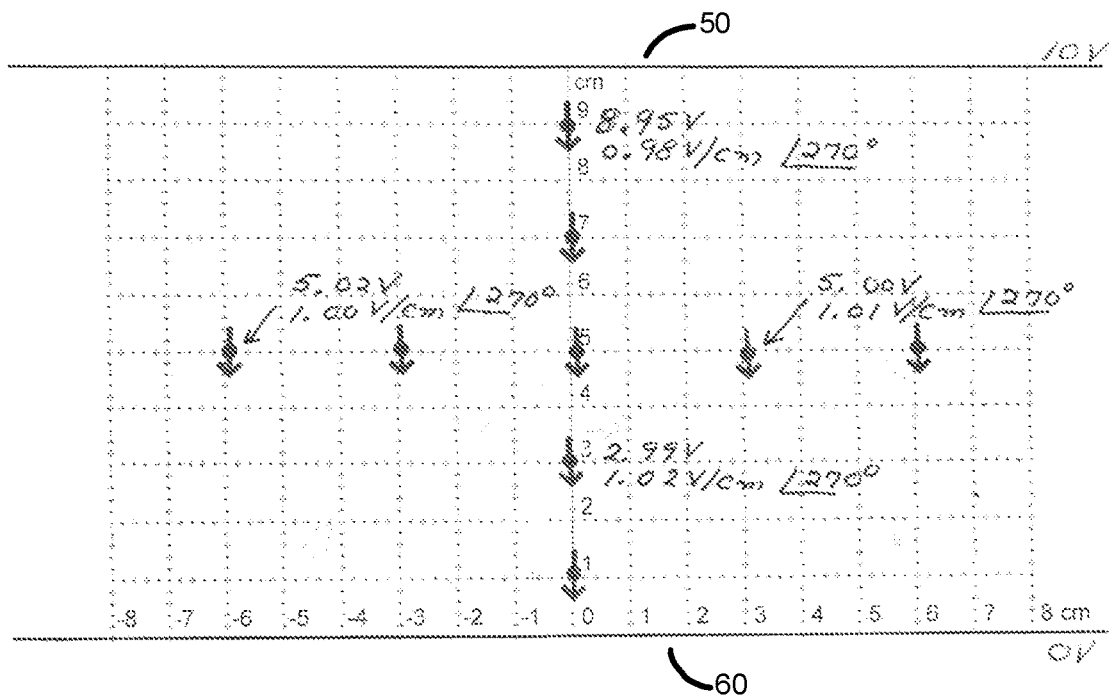
Fig. 6a
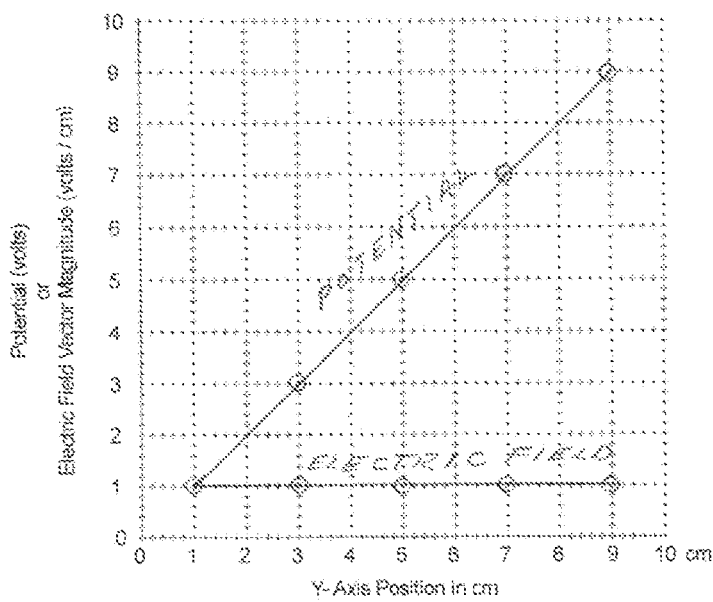
Fig. 6c
Fig. 6b

ELECTRIC POTENTIAL AND ELECTRIC FIELD MAPPING SYSTEM

BACKGROUND OF THE INVENTION

This invention pertains to the field of education. Specifically, it concerns an apparatus and a data-gathering and recording method that enables students to simultaneously measure and record the magnitude of electric potential and the magnitude and direction of the electric field vector. These data-gathering and recording methods lead to the formation of an electric field map. This invention is well suited to be part of the science, technology, engineering, and mathematics (STEM) educational curriculum because it demonstrates and integrates STEM concepts into a single stand-alone hands-on system. The field mapping system may be configured to be used by students from grade-level thru college-level.

Our modern age contains examples, in all aspects of human existence, of the proliferation of technology and the growth of knowledge. STEM workers play a key role in the sustained growth and stability of the U.S. economy and are critical components to helping the U.S. remain in the forefront. Every day new products are introduced into the marketplace that perform a task better and more effectively than the previous version. Advances in technology start in the classroom where students learn the basic scientific principles that form the foundation for continued learning and development. Young minds are impressionable, and a proper understanding of basic scientific principles is essential to the advancement of new technology.

Students should have the opportunity to visualize, measure, record, and verify a concept in addition to learning about it from a book or computer. With this field mapping system one or more students will physically interact with the system as they measure and record the electric potential and electric field vector. By working in teams and interacting with each other, students can discuss and question the results and learn from each other.

Educational field mapping devices generally utilize highly conducting electrodes that are in contact with a conducting medium and separated by a voltage difference. In the conductive medium current flows from the higher-potential electrode to the lower-potential electrode as the potential decreases in the direction of current flow. This physical principle and the analogy between electric current and electric field is used by all current devices, and this invention, to demonstrate and explain the concepts of electric potential and electric field.

Current devices use a voltage source, a single-probe sensor to measure the electric potential, a single voltmeter to display the electric potential and a single "point marker" to record the electric potential. For this reason, prior art can neither measure nor record the direction or magnitude of an electric field vector.

All current commercial field mapping devices have drawbacks and limitations that this invention addresses. First, none is a complete stand-alone and portable system that requires only the addition of water and paper to perform an experiment. Second, none enable the student to simultaneously measure and record the voltage of an electric potential point and the magnitude and direction of the electric field vector. This quantitative data would enable students to produce an electric field map, as well as plot and analyze the quantitative results. For example, plots such as electric potential versus distance from an electrode, or magnitude of the electric field vector versus distance from an electrode are not only possible but closely match that of theory. Third, prior art requires additional external parts such as power supplies, voltmeters, galvanometers, and hardware. This makes connecting the parts difficult. Fourth, none of the devices utilize magnetic force to hold the electrodes in place over a template of the charge configuration under test. Fifth, none of the other devices provide at least four markers that provide different representations of electric field elements. Sixth, several of the commercial devices require special conductive paper that must be replaced after each experiment and may also require the use of an expensive conductive ink pen to draw electrodes on the conductive paper. Seventh, all current commercial devices require the student to hand-plot equipotential lines and electric field lines. For example, after the student marks an array of equal electric potential points, he or she must connect them by hand to form an equipotential line. To form an electric field line, the student must then draw lines with arrows that are perpendicular to an equipotential line that points in the direction of decreasing potential. These manual steps do not provide quantitative results and can lead to long testing times, recording errors, and lack of repeatability. Eighth, one device has the recording medium on the top side with the electrodes and conductive medium hidden from the student's view on the bottom side. Ninth, several of these commercial field mapping devices use 120 VAC-powered equipment.

SUMMARY OF THE INVENTION

This invention overcomes the drawbacks and limitations of current educational field mapping devices. It provides the educational community with a field mapping system that has an improved measurement and recording method which enables students to produce an electric field map that is quantitative, accurate and repeatable. As this field data is being measured in the space around two or more electrodes, it is simultaneously transferred to, and recorded with a recording medium. Measurements of an electric potential point and an electric field vector may be made by a three-probe sensor with pointer and displayed on two voltmeters. An angular scale below the pointer may assist to measure the direction of the electric field. An X-Y transfer mechanism transfers the location of the three-probe sensor, from the space around electrodes, to a marker at a corresponding location in the recording area. Recordings of the field data are made by markers with different impressions and may include an electric field vector, equipotential line segment, and electric potential point. The selection of the measurement and recording methods depends on the type of data required and/or the age of the students being served. The invention provides a new and useful learning tool that will increase interest in and enhance a student's understanding of field phenomena.

BRIEF DESCRIPTION OF DRAWINGS

FIG. 3a shows a top plan view of a preferred embodiment of the present invention.

FIG. 3b shows a cross sectional view of the invention taken at line I in FIG. 3a.

FIG. 3c shows an enlarged view of a portion of the cross sectional view of FIG. 3b.

FIG. 4a shows a side elevational view of a preferred embodiment of the X-Y transfer mechanism.

FIG. 4b shows a top cross sectional view of the X-Y transfer mechanism taken at line I in FIG. 4a.

FIG. 4c shows a top cross sectional view of the X-Y transfer mechanism taken at line II in FIG. 4a.

FIG. 6a shows a map of sample recorded data at their relative positions in the charge configuration and measurement section of the invention for a parallel-plates-of-charge configuration.

FIG. 6b shows a data chart of the data recorded in FIG. 6a for a parallel plates of charge configuration.

FIG. 6c shows a graphical representation of the electric potential and electric field data of 6b relative to Y-axis positions for the parallel-plates-of-charge configuration.

DETAILED DESCRIPTION OF INVENTION

Figure 1:
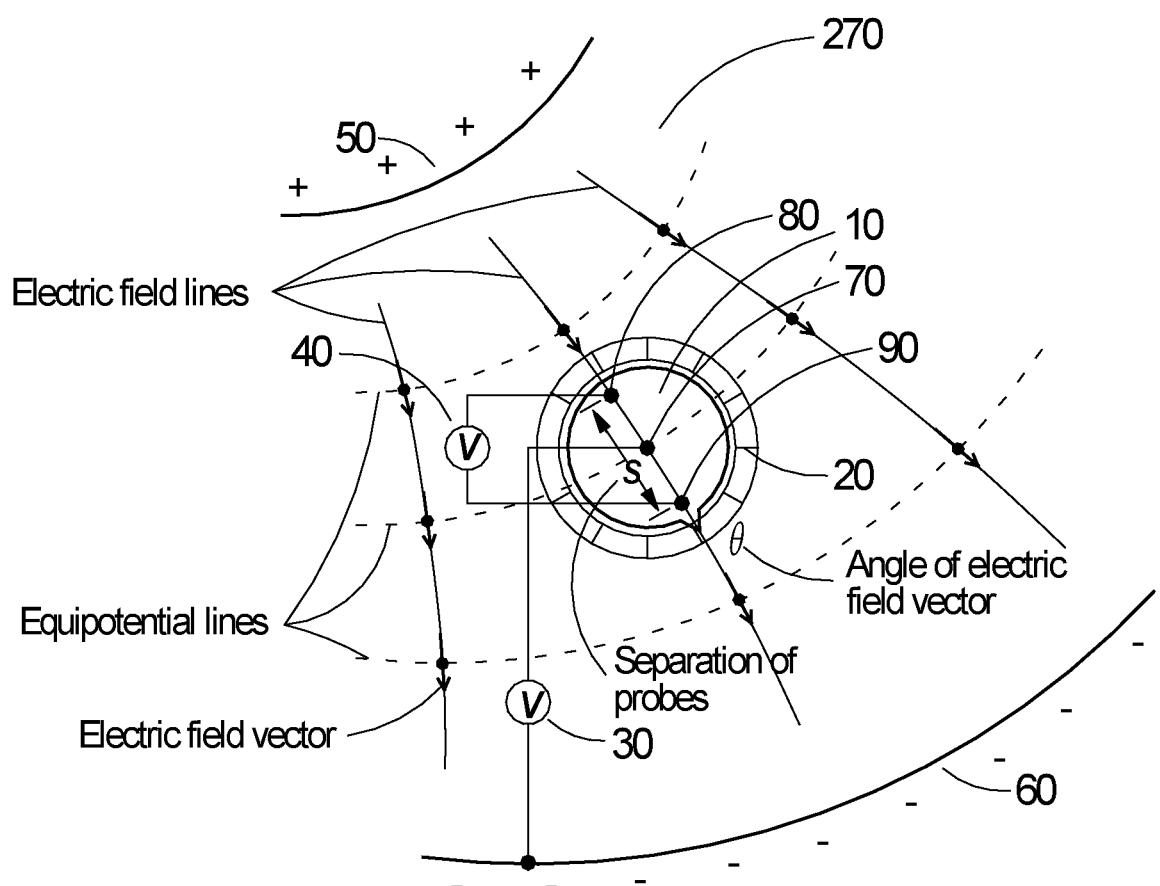
FIG. 1 shows a diagram of how two sources of charge or electrodes alter the space around them to create an electric field. Also shown is the three-probe sensor and the methods to measure an electric potential point and electric field vector.

The invention is comprised of a system for measuring, transferring, and recording the electric potential, electric field and the direction of the electric field in the space around two or more electrodes immersed in a conductive medium, to a recording medium. In a preferred embodiment, the conductive medium is water, and the recording medium is plain paper. A sensor with three probes 10 senses the electric potential and magnitude of electric field in the conductive medium. [FIG. 1] In a preferred embodiment, the probe is a three-probe sensor with pointer 10 that may be configured to measure electric potential. In another preferred embodiment the three-probe sensor with pointer 10 above an angular scale 20 may sense both the magnitude of the electric field in volts per centimeter (V/cm) and the direction of the electric filed in degrees. These voltages (the electric potential and the magnitude of electric field) may then be measured and displayed by two voltmeters. To record the data obtained from the sensor, a marker with pointer 210 may imprint locations and/or directions of equipotential lines and electric field lines on a paper medium. [FIGS. 3 and 5]. Alternately, the marker with pointer 210 may be configured to imprint locations and/or directions of equipotential lines and electric field lines in a digital medium in the Recording section. The marker may be configured to make a number of different impressions (e.g. arrows, points, directional lines) to denote the positions and directions of equipotential lines and electric field lines.

The student may use the three-probe sensor with pointer 10 to measure an electric potential at multiple points in the space around a supply electrode 50 and a return electrode 60. This is done by taking a voltage measurement between the center or potential probe 70 of the three-probe sensor with pointer 10 and return electrode 60. Locations of identical electric potentials create an equipotential line as shown in FIG. 1.

The student may also use the three-probe sensor with pointer 10 to measure the magnitude and direction of the electric field in the space around the supply 50 and return electrode 60 by taking a voltage measurement between two outer probes of the three-probe sensor with pointer 10. [FIG. 1] These are the first electric field probe 80 and second electric field probe 90. The first electric field probe 80 and second electric field probe 90 are connected to a voltmeter to measure the voltage difference between the two probes. The three-probe sensor with pointer 10 may be rotated, and the direction of the electric field vector recorded at the point at the angle where the differential voltage is maximum.

Figure 5:
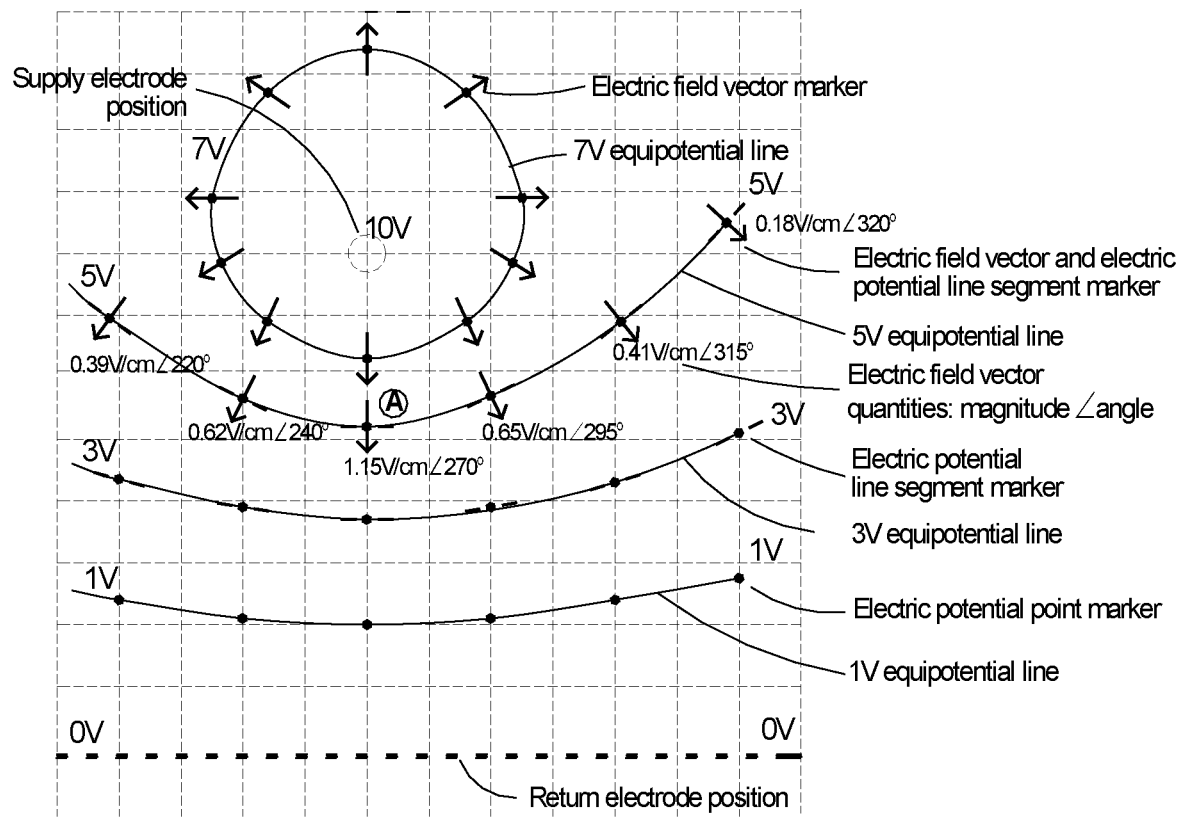
FIG. 5 shows a diagram of electric field elements recorded in the recording section of the invention which summarizes methods used to convey electric field elements in the space around a supply electrode and a return electrode.

The three-probe sensor with pointer 10 and marker with pointer 210, may be about 30 cm apart and are mechanically linked together in such a manner that both their X-Y positions follow each other. [FIGS. 3a and 3b] The relative positions of the sensor with pointer 10 and marker with pointer 210 may be controlled by an X-Y transfer mechanism 180. Before data is imprinted and recorded, the three-probe sensor 10 and marker 210 combination may be moved to a particular electric potential point in the space around the electrodes by using X control knob 280 and Y control knob 360 on the X-Y transfer mechanism 180. Once the position for a particular electric potential is achieved, the three-probe sensor may be rotated to obtain the magnitude and angle of the electric field. The marker with pointer 210 may then be set to the same angle as the three-probe sensor with pointer 10. Then the student may mark the electric potential point and the electric field vector by pressing on the marker with pointer 210 and record the electric potential magnitude and direction of the electric field vector on a map/diagram as shown in FIG. 5. Importantly, the marker with pointer makes impressions on a recording medium as shown in FIG. 5. However, FIG. 5 also depicts in dashed lines supply electrode 50 and return electrode 60. Although supply electrode 50 and return electrode 60 are physically located in the charge and configuration section as shown in FIG. 3a, they are depicted in dashed lines in FIG. 5 (showing the recorded data) to illustrate the corresponding positions of the electric field lines and equipotential lines with respect to the supply and return electrodes.

Consider the example of recording the magnitude and direction of electric field vectors along the 5V equipotential line. [FIG. 3a and FIG. 5] The supply electrode 50 is at 10V and the return electrode 60 is at 0V. While monitoring the electric potential voltmeter 30, the student user may adjust the X-Y controls to move the three-probe sensor 10 to a position along a line that is perpendicular to the return electrode 60 and passes through the supply electrode 50, until the potential voltmeter 30 reads 5.00V. [Point A, FIG. 5] To find the magnitude and direction of the electric field at this location the student monitors the electric field voltmeter 40 while rotating the three-probe sensor with pointer 10 and observing the angular scale 20 until the magnitude of the voltage is maximum. At this location [Point A, FIG. 5] the electric field vector is 1.15V/cm <270°. At this location in the recording section, the user may then adjust the angle of the marker with pointer 210 to 270° and press the marker to record the direction of the electric field. The marker may leave an impression of a dot, an arrow, and a dash. The dot is a 5.00V potential point, the arrow is in the direction of the electric field vector and the dash is along the equipotential line. Next to the impression (on the 5V equipotential) the student may record the magnitude and angle of the electric field, at this location 1.15V/cm ∠ 270°. As more data points are measured and recorded the 5V equipotential line with electric field vectors is produced.

FIG. 1 is a visualization of a field map and details the methods used by this invention to measure electric potential points and electric field vectors in a conductive medium 270 in the space around a supply electrode 50 and a return electrode 60. In the conductive medium 270 current flows from the source electrode 50 to the return electrode 60 as the potential decreases in the direction of current flow. An electric potential point may be sensed by electric potential probe 70 of three-probe sensor with pointer 10 and displayed on electric potential voltmeter 30. The magnitude of the electric field vector may be sensed by first electric field probe 80 and second electric field probe 90 of three-probe sensor with pointer 10 and displayed on the electric field voltmeter 40. The angle of the vector θ is displayed on the angular scale 20 below the three-probe sensor with pointer 10. Because the outer probes 80, 90 are spaced a known distance S apart, the magnitude of the electric field can be measured in volts per unit distance. In a preferred embodiment, the distance S is one centimeter and the units of the magnitude of the electric field vector are V/cm. As the three-probe sensor with pointer 10 is rotated, first electric field probe 80 and second electric field probe 90 will change position relative to the supply electrode 50 and return electrode 60. The direction of the electric field vector will be at the point where the voltage differential between first 80 and second 90 electric field probes is at its maximum. As more data are measured and recorded, a field map showing multiple equipotential lines and electric field lines may be produced. See FIG. 5.

Figure 2:
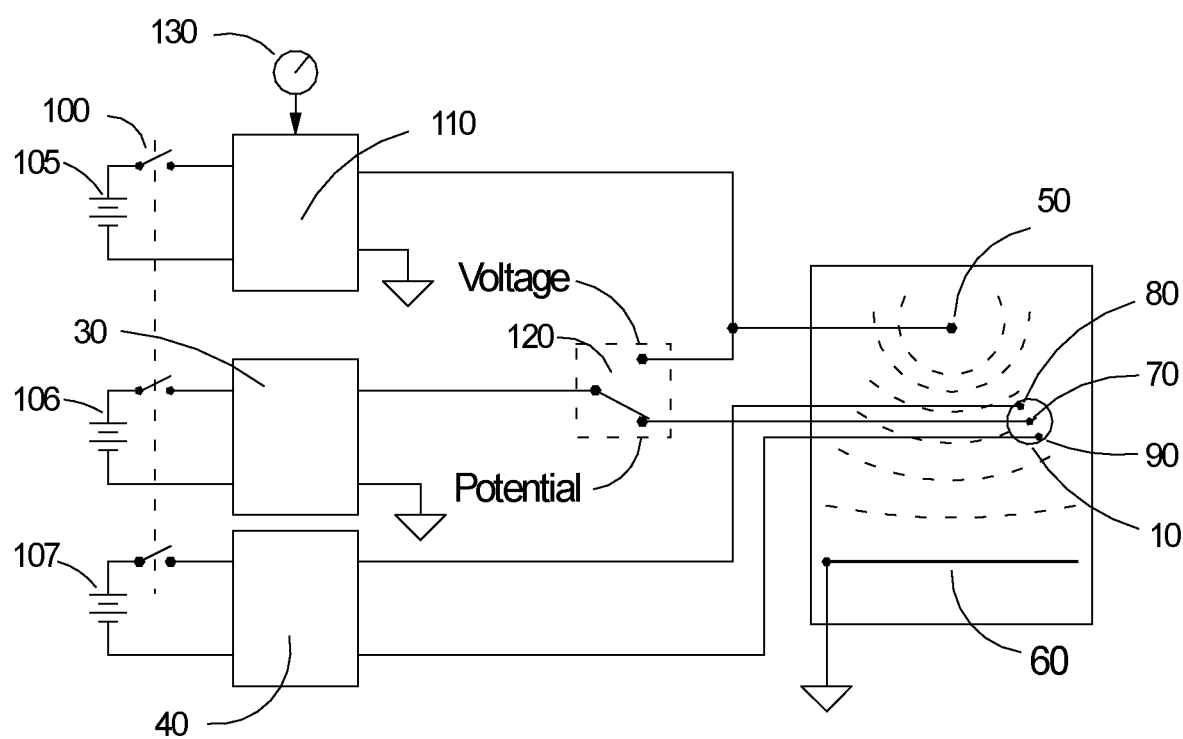
FIG. 2 shows a diagram of a preferred embodiment of the electrical components and connections of this invention.

FIG. 2 shows a diagram of the electrical components and connections of a preferred embodiment of the present invention. The power switch 100 enables electrical power to flow from power sources 105, 106, and 107 (preferably batteries) to the regulated voltage source 110, the electric potential voltmeter 30 and the electric field voltmeter 40. The regulated voltage source may provide a regulated and adjustable voltage between supply electrode 50 and return electrode 60. Electric potential voltmeter 30 may measure and display the electric potential at the position of the three-probe sensor with pointer 10. Battery two 106 provides power to electric potential voltmeter 30. As noted above, the direction of electric field vector may be determined by rotating the three-probe sensor with pointer 10 to an angle where the voltage potential between probes 80 and 90 is maximum. Electric field voltmeter 40 is connected to probes 80 and 90 to facilitate the measurement. Battery three 107 provides power to electric field voltmeter 40.

The voltage between the supply electrode 50 and the return electrode 60 is variable. In a preferred embodiment may be adjusted between 9.5V and 10.5V. When the potential or voltage selection switch 120 is placed in the voltage position, the voltage between the supply electrode 50 and the return electrode 60 may be adjusted using the voltage adjustment dial 130 and electric potential voltmeter 30. After the voltage has been adjusted the potential or voltage selection switch 120 may be placed in the potential position and the voltage of electric potential probe 70 is displayed on electric potential voltmeter 30. In the preferred embodiment the magnitude of the electric field vector between first electric field probe 80 and second electric field probe 90 of the three-probe sensor with pointer 10 is displayed on electric field voltmeter 40.

In a preferred embodiment, low voltage batteries are used for the source of power, thus improving safety for all levels of students in both classroom and home. Students with little experience must be protected against dangerous levels of voltage such as those present at a 120 VAC receptacle.

FIG. 3a details how the four sections of the system interface with each other. The four sections are Voltage Regulation and Display, Charge Configuration and Measurement, Transfer, and Recording.

The Voltage Regulation and Display section may include electric potential voltmeter 30, electric field voltmeter 40, voltage adjustment dial 130, power switch 100, potential or voltage selection switch 120, and power sources 105, 106, and 107. In addition, there may be three receptacles that interface with the Charge Configuration section. These are a supply receptacle 140, a sensor receptacle 150 and a return receptacle 160.

In a preferred embodiment the measurements necessary to determine an electric potential and an electric field vector may be performed in a transparent container 230 that is a component of the Charge Configuration and Measurement section. The transparent container 230 holds a conductive medium 270. In a preferred embodiment, the conductive medium is water. A charge configuration template 170 for the configuration under investigation is below the container 230. The supply electrode 50, return electrode 60 and three-probe sensor with pointer 10 are in the container 230 and in contact with the conductive medium. Magnets 240 are integral parts of both the supply electrode 50 and return electrode 60 and may be used to hold the supply electrode 50 and return electrode 60 in fixed positions during electric potential and electric field measurements. Magnets 240 may be secured to container 230 where a steel sheet 250 or sheet of another ferrous metal is incorporated below the container. Magnets further allow these electrodes to be easily moved so that students may note changes in the electric potential and electric field vectors which occur with changes in the configuration of the electrodes 50 and 60. Additionally, where the container is transparent, a charge configuration template 170 may be visible when positioned below the container.

An angular scale 20 may be included below the three-probe sensor with pointer 10. Supply cable 55 from supply receptacle 140 is connected to supply electrode 50, return cable 65 from return receptacle 160 is connected to return electrode 60, and sensor cable 15 from three-probe sensor with pointer 10 is connected to sensor receptacle 150.

In the Transfer section, the X-Y transfer mechanism 180, X-arm 190, and Y-arm 200 synchronize the movement of the three-probe sensor with pointer 10 with the movement of marker with pointer 210.

In the Recording section marker with pointer 210, with its angular scale 20 below the pointer, may be rotated to the angle measured by the three-probe sensor with pointer 10 in the Charge Configuration and Measurement section. An identical copy of the charge configuration template 170 used in the Charge Configuration and Measurement section may be used in the Recording section.

Electric potential points may be recorded at the relative positions of similar voltage potential as measured in the charge configuration and measurement section. At each point where electric potential is measured, the magnitude and direction of the electric field vector may also be measured by noting the difference in voltage between electric field probes 80 and 90. The electric field vectors may be recorded onto the template by rotating the marker 210 to same angular position as three-probe sensor with pointer 10 and pressing the marker with pointer 210 to record an arrow mark showing the direction of the electric field in the recording section.

Section View I-I shown in FIG. 3b includes details of how the three-probe sensor with pointer 10 can be mounted to the X-arm 190 to measure an electric potential point and an electric field vector. The sensor's probes extend into container 230 and conductive medium 270. When the optimum values of the electric potential and magnitude of the electric field vector have been established, the pointer is above the angle of the vector as shown on the angular scale 20. Beneath the recording section there may be an accessory storage compartment 220.

FIG. 3c shows, an enlarged view of the lower portion of the left side of the return electrode 60, depicted with a dashed circle in FIG. 3b, and shows the details of how the return electrode 60, with its integral magnet 240, may be held in place above the bottom of the container 230 and charge configuration template 170, by the attractive force between the magnet 240 and a steel sheet 260 below.

FIG. 4a demonstrates how a X-arm with rack 190 and a Y-arm with rack 200, which comprise X-Y transfer mechanism 180, interact with each other. Three-probe sensor with pointer 10 is mounted on a first end of the X-arm with rack 190, in the Charge Configuration section, and the marker with pointer 210 is mounted on a second end of the X-arm in the Recording section. Rotation of the X-arm control knob 280 moves only the X-arm with rack 190 with respect to the X-Y transfer mechanism. The X arm control knob 280 may be rotated such that the X-arm moves horizontally (−X and +X directions) with respect to the X-Y transfer mechanism. Similarly, when rotated, the Y-arm control knob 350 moves both the X-Y transfer mechanism 180 and X-arm with rack 190 vertically (in −Y and +Y directions) along the Y arm. This occurs because the Y-arm with rack 200 is held in place by the end supports 380.

Section view I-I shown in FIG. 4b details how the X-arm with rack 190 is moved by the X-arm control knob 280. Because the X-arm control knob 280, X-pinion drive shaft 290 and X-arm pinion 300 are physically connected, rotation of the X-arm control knob 280 results in linear motion of the X-arm with rack 190. Alignment of the X-arm with rack 190 is provided on one side by the X-arm guide 310 and on the other side by both the X-arm pinion 300 and X-arm alignment gear 320. The X-arm alignment gear 320 is free to turn on the Y-pinion drive shaft 330. To further assist in positioning the sensor-marker combination both X arm with rack 190 and Y arm 200 may include centimeter-spaced lines 340.

Section view II-II shown in FIG. 4c details how the X-Y transfer mechanism 180 is moved. The Y-arm control knob 350, Y-pinion drive shaft 330 and Y-arm pinion 370 are physically connected. Rotation of the Y-arm control knob 350 should result in linear motion of the Y-arm with rack 210. However, because the ends of the Y-arm with rack 200 are fixed by Y-arm end supports 380, rotation of the Y-arm control knob 350 results in linear Y-motion of both the X-Y transfer mechanism 180 and its integral X-arm 190. Alignment of the Y-arm 200 with rack is provided on one side by the Y-arm guide 390 and on the other side by both the Y-arm alignment gear 400 and Y-arm pinion 370. The Y-arm alignment gear 400 is free to turn on its axle 430.

FIG. 5 illustrates representations of electric field elements in the space around a 10-volt supply electrode 50 and a 0-volt return electrode 60. Examples of the three quantities measured in the Charge Configuration and Measurement section (potential V, electric field magnitude E, and angle <θ), have been included on the 5V equipotential. The 1V, 3V, 5V and 7V equipotential lines show four different impressions (markings) to represent electric field elements.

FIGS. 6a, 6b and 6c are examples of measured, recorded, and graphed results for parallel plates of charge, i.e. when supply electrode 50 is a linear electrode and return electrode 60 is also linear and parallel to supply electrode 50. The supply electrode 50 is at 10V potential and located at 10 cm. The return electrode 60 is at 0V potential and located a 0 cm. FIG. 6a shows a recorded array of electric field vector impressions along the Y-axis and X-axis. Measured and numerical data has been entered next to several electric field vectors. In practice these data are entered by the student. In FIG. 6b, a complete set of the measurements made by the three-probe sensor with pointer 10 has been entered in the Y-axis Measurement and X-axis Measurement tables. FIG. 6c uses Y-axis measurements to plot both the electric potential and electric field magnitude versus distance from the 0V return electrode 60.

The recorded and measured results in these figures confirm the theory for parallel plates of charge, more commonly called a parallel-plate capacitor. That is, in the space between parallel plates of charge the magnitude of the electric field vector is uniform, the direction of the vector is from a higher and a lower potential, and the magnitude of potential increases in direct proportion to the distance from the 0V plate. The magnitude of the electric field vector is approximately 1.0 V/cm, and its angle is 270° throughout the space between plates. Another characteristic of electric fields is that electric field lines are perpendicular to equipotential lines. The figures show that the electric potential increases in direct proportion to the Y-axis position or distance from the 0V plate. Finally, the relation between electric potential V and electric field E, $$E_y = \left| -\frac{\Delta V}{\Delta y} \right|$$

may be applied to FIG. 6c to verify that the magnitude of the electric field vector is constant and approximately 1V/cm.

I claim:

1. An electric potential and electric field mapping system comprising:

A voltage regulation and display section comprising at least one electric power source to provide a regulated voltage to a charge configuration and measurement section, and the charge configuration and measurement section comprising at least one supply electrode in a conductive medium, at least one return electrode in a conductive medium and a means to measure electric potential within the conductive medium, and a transfer section comprising an X arm, a Y arm, and an X-Y transfer mechanism as a means to transfer data from within the conductive medium to the recording section and a recording section comprising a means to record data with a recording medium.

2. An electric potential and electric field mapping system as in claim 1 wherein the means to measure electrical potential within the conductive medium comprises a sensor with at least one electric potential probe configured to come into contact with the conductive medium.

3. An electric potential and electric field mapping system as in claim 2 wherein the sensor further comprises a first electric field probe and a second electric field probe separated by a known distance for detecting the magnitude of the electric field between the two probes.

4. An electric potential and electric field mapping system as in claim 1 wherein at least one power source provides regulated voltage to at least one supply electrode to create voltage potentials within the conductive medium.

5. An electric potential and electric field mapping system as in claim 2 wherein the means to measure electric potential further comprises an electric potential voltmeter to measure electric potential between the at least one electric potential probe and at least one return electrode.

6. An electric potential and electric field mapping system as in claim 3 further comprising an electric field voltmeter to measure the differential electric potential between the first electric field probe and the second electric field probe to determine the magnitude and direction of the electric field vector within the conductive medium.

7. An electric potential and electric field mapping system as in claim 2 wherein the X arm is oriented perpendicular to the Y arm, the X-Y transfer mechanism being moveably attached to the Y arm, and the X arm being movably attached to the X-Y transfer mechanism, the sensor being positioned at a first end of the X arm within the adjoining conductive medium and the means to record data being positioned at a second end of the X arm adjoining the recording medium.

8. An electric potential and electric field mapping system as in claim 3 wherein the sensor is rotatable enabling determination of the magnitude and direction of the electric field vector.

9. An electric potential and electric field mapping system as in claim 7 wherein the X-Y transfer mechanism is movable vertically along the Y arm by turning a Y arm control knob and Y arm pinion connected to the Y arm, and wherein the X arm is moveable horizontally along the X-Y transfer mechanism by turning an X arm control knob and X arm pinion connected to the X arm.

10. An electric potential and electric field mapping system as in claim 7 wherein the means to record data comprises a marker.

11. An electric potential and electric field mapping system as in claim 10 wherein the marker is rotatable and attached to the second end of the X arm.

12. An electric potential and electric field mapping system as in claim 11 wherein the sensor further comprises an angular scale and marker further comprises an angular scale wherein the marker may be rotated to match the angular position of the sensor.

13. An electric potential and electric field mapping system as in claim 12 wherein the marker further comprises at least one electric field vector impression and at least one electric potential point impression to record the direction and location of the electric field vector and the electric potential point.

14. An electric potential and electric field mapping system as in claim 12 wherein the marker is moveable in a downward direction toward the recording medium and moveable in an upward direction away from the recording medium to facilitate the entry of quantitative results.

15. An electric potential and electric field mapping system as in claim 1 wherein the recording medium is paper.

16. An electric potential and electric field mapping system as in claim 1 wherein the recording medium is digital.

17. An electric potential and electric field mapping system as in claim 1 further comprising a container to contain the conductive medium.

18. An electric potential and electric field mapping system as in claim 17 wherein at least one supply electrode further comprises a magnet and the at least one return electrode further comprises a magnet, the magnets being removably connected to the container through a force of magnetic attraction.

\* \* \* \* \*